(12) United States Patent
Yoshida

(10) Patent No.: US 7,683,492 B2
(45) Date of Patent: Mar. 23, 2010

(54) SEMICONDUCTOR DEVICE

(75) Inventor: Kenji Yoshida, Yokohama (JP)

(73) Assignees: System Fabrication Technologies, Inc., Yokohama-shi (JP); Liquid Design Systems, Inc.

( * ) Notice: Subject to any disclaimer, the term of this patent is extended or adjusted under 35 U.S.C. 154(b) by 552 days.

(21) Appl. No.: 11/658,638

(22) PCT Filed: Jul. 26, 2005

(86) PCT No.: PCT/JP2005/013645
§ 371 (c)(1),
(2), (4) Date: Jan. 26, 2007

(87) PCT Pub. No.: WO2006/011477
PCT Pub. Date: Feb. 2, 2006

(65) Prior Publication Data
US 2009/0224241 A1    Sep. 10, 2009

(30) Foreign Application Priority Data
Jul. 26, 2004   (JP) .............................. 2004-217735

(51) Int. Cl.
*H01L 25/18* (2006.01)
*H01L 25/04* (2006.01)
(52) U.S. Cl. .................. 257/778; 257/48; 257/673; 257/676; 257/773; 257/E23.002; 257/E23.141; 438/108
(58) Field of Classification Search .................. 257/48, 257/673, 676, 773, E23.002, E23.141; 438/108
See application file for complete search history.

(56) References Cited

U.S. PATENT DOCUMENTS 6,436,735 B1 * 8/2002 Goetz et al. ................ 438/125

(Continued)

FOREIGN PATENT DOCUMENTS

JP    10335574    12/1998

(Continued)

OTHER PUBLICATIONS

International Search Report PCT/JP2005/013645; mailed Oct. 18, 2005 (English and Japanese).

(Continued)

*Primary Examiner*—Zandra Smith
*Assistant Examiner*—Jeremy J Joy
(74) *Attorney, Agent, or Firm*—Marshall Gerstein & Borun LLP

(57) ABSTRACT

The present invention provides a semiconductor device which can realize the mounting of a plurality of chips at a high-speed, with high packaging density and at a low cost. In mounting a memory device chip 103 and an ASIC 104 on a wiring chip 102, connection pads 110, 116 are respectively formed along one opposing sides of the memory device chip 103 and the ASIC 104 on the wiring chip 102, the arrangement positions of the respective connection pads 110, 116 define the shortest distance assumes the shortest distance therebetween and, at the same time wiring lines which are formed on the wiring chip 102 are also shortened. Accordingly, it is possible to mount the memory device chip 103 and the ASIC 104 on the wiring chip 102 with high packaging density and, at the same time, since the wiring distance can be shortened, the high speed operation can be realized.

11 Claims, 10 Drawing Sheets

U.S. PATENT DOCUMENTS

| | | | |
|---|---|---|---|
| 2002/0041009 A1* | 4/2002 | Yamaguchi et al. | 257/664 |
| 2002/0056911 A1* | 5/2002 | Iwaya et al. | 257/738 |
| 2002/0079591 A1* | 6/2002 | Sakiyama et al. | 257/777 |
| 2003/0008424 A1* | 1/2003 | Kajiwara et al. | 438/18 |
| 2003/0098506 A1* | 5/2003 | Haraguchi et al. | 257/735 |
| 2003/0183931 A1* | 10/2003 | Isobe | 257/734 |
| 2004/0017008 A1* | 1/2004 | Ueda | 257/734 |
| 2008/0179735 A1* | 7/2008 | Urakawa | 257/691 |

FOREIGN PATENT DOCUMENTS

| | | |
|---|---|---|
| JP | 2001094032 | 4/2001 |
| JP | 2002084108 | 3/2002 |
| JP | 2002190568 A | 7/2002 |
| JP | 2003-282789 | 10/2002 |
| JP | 2003100949 | 4/2003 |
| JP | 2003-158238 | 5/2003 |
| JP | 2003282656 | 10/2003 |
| JP | 2003007960 A | 1/2004 |
| JP | 2004063761 A | 2/2004 |
| JP | 2004134715 A | 4/2004 |

OTHER PUBLICATIONS

International Preliminary Report of Patentability PCT/JP2005/013645, Oct. 13, 2006.

Extended European Search Report issued in EP 05 76 7240 application by the European Patent Office mailed on May 30, 2008.

* cited by examiner

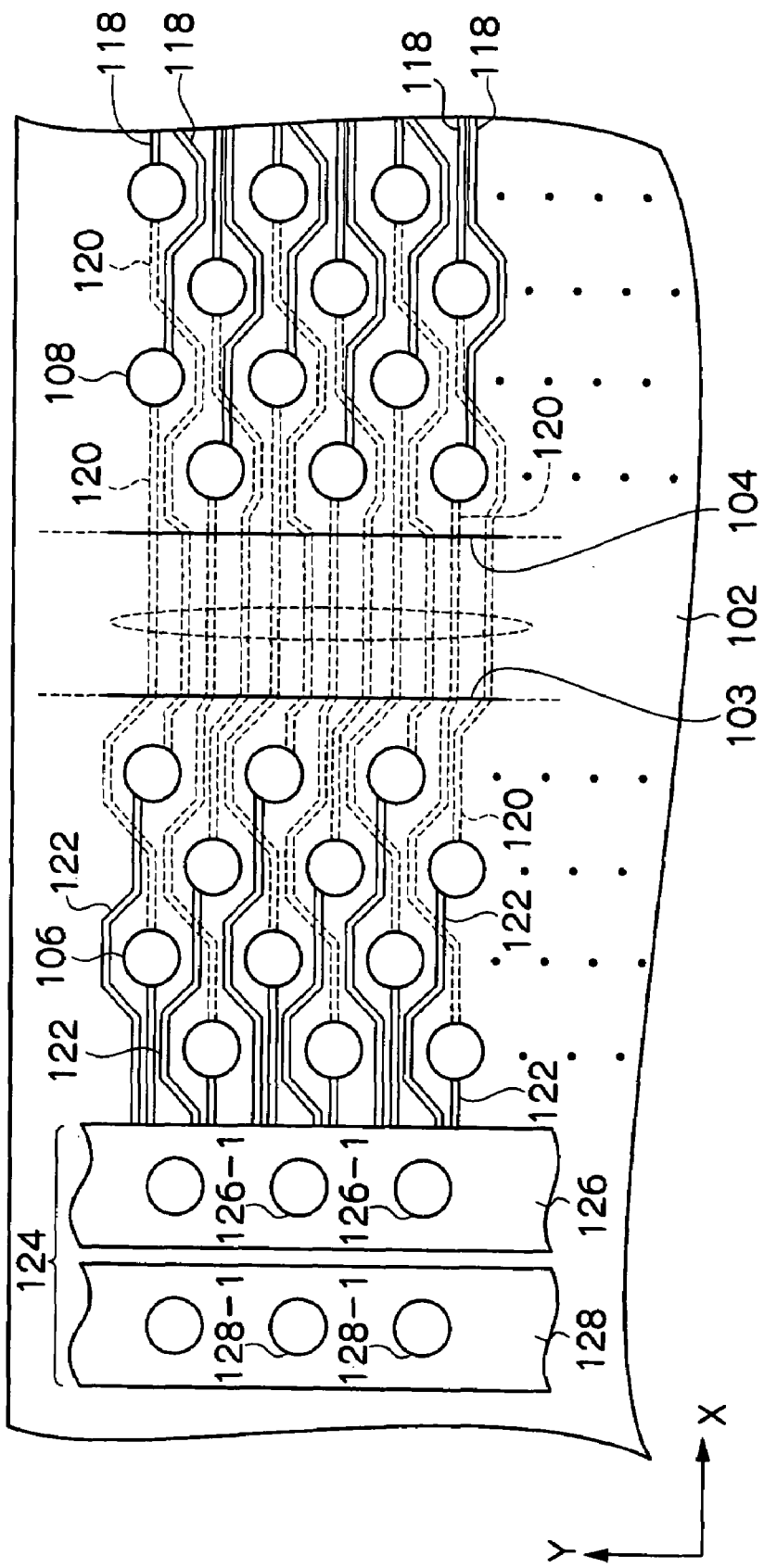

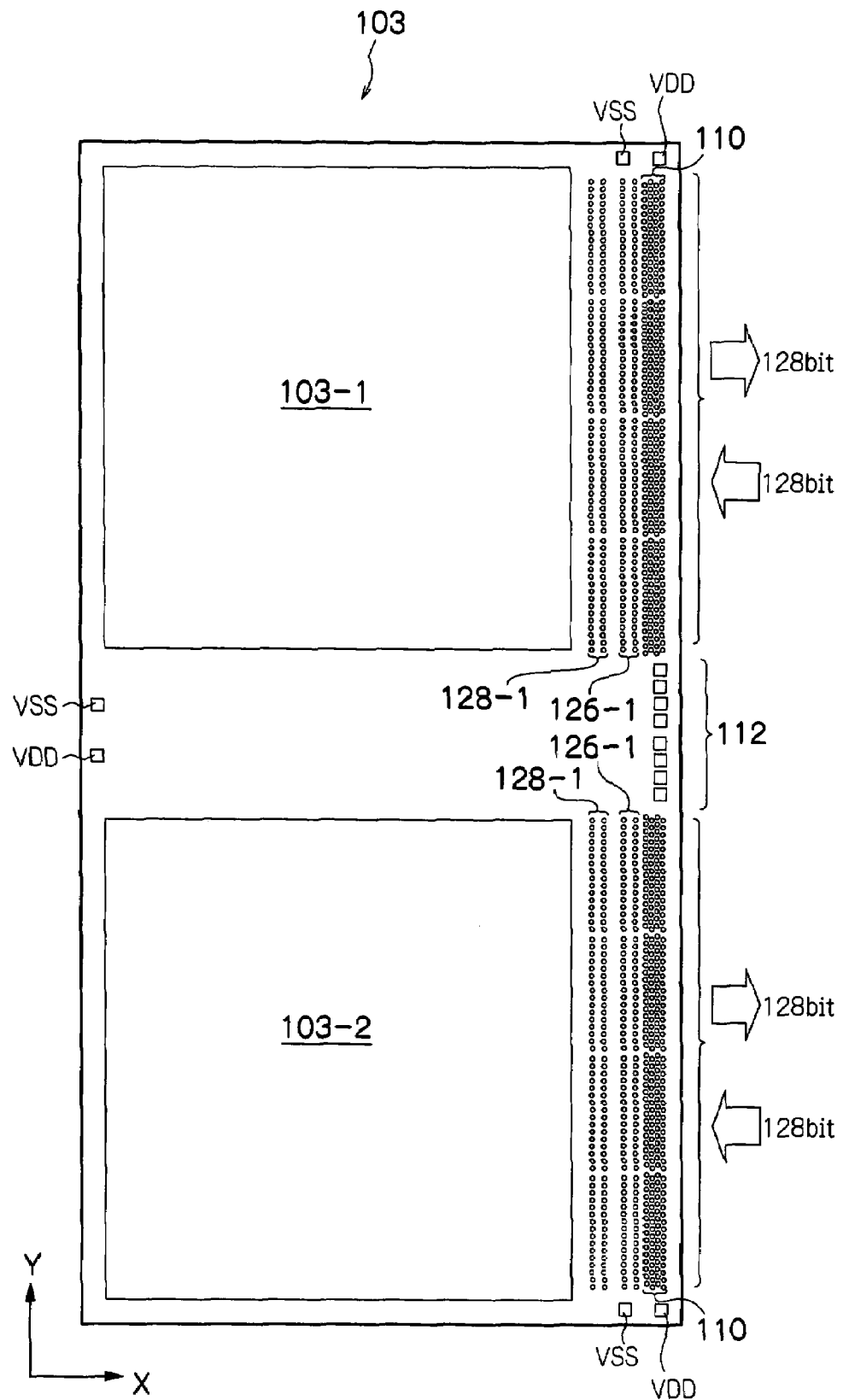

SEMICONDUCTOR DEVICE

TECHNICAL FIELD

The present invention relates to a semiconductor device, and more particularly to a semiconductor device on which chips are mounted with high packaging density.

BACKGROUND ART

Conventionally, semiconductor devices have benefited from lowering manufacturing cost, increasing operation speeds, lowering power consumption and increasing reliability from increasing integration in accordance with Moore's Law. However, when design rules become finer than 180 nanometers, referred to as SOC (System On Chip), the scale of a system which can be integrated onto a chip becomes extremely large.

To achieve even higher integration, there arises a demand for simultaneously integrating a large-scale memory circuit such as a DRAM or flash memory together with a high-speed analog circuit such as an RF.

However, to form these circuits on one chip, a wafer manufacturing process becomes extremely complicated and hence, the optimization of the manufacturing process for respective functions of mounted logic memory analog and the like becomes difficult. The integration of these circuits on one chip also gives rise to drawbacks such as the increase of leakage and substrate noise.

Further, although memory cells, logic cells and the like enjoy benefits by miniaturization of the semiconductor circuit, it is difficult to miniaturize an interface circuit, an analog circuit, a high breakdown resistance circuit and the like and hence, areas which these circuits occupy in the chip become non-uniform. Further, a cost for development including an expense for masks and a period for development are remarkably increased. These conditions are fatal to the semiconductor device also in view of the shortening of product lifetime in a market of final products.

In view of the above, particularly with respect to a system which performs an SOC in the wafer manufacturing process with a design rule exceeding 90 nanometers, an extremely high performance is requested and, at the same time, the system is limited to a system which is capable of realizing the mass production. To obviate such drawbacks, a technique which is referred to as a SIP (System In Package) which obviates the above-mentioned drawbacks by storing a plurality of semiconductor integrated circuit chips or different kinds of chips in one package is spreading. With the use of this technique, it is possible to make the semiconductor device have multi functions such as mixed mounting using chips made by different companies or mixed mounting of chips using different kinds of optical, mechanical chips or the like.

Such a conventional SIP technique is disclosed, for example, in patent document 1 or in patent document 2. In this conventional SIP, for example, two different semiconductor integrated circuit chips are laminated on a lead frame in a stacked manner. That is, the SIP is configured such that the semiconductor chip is mounted on the lead frame, and the semiconductor chip is mounted on a chip. Further, in the SIP, the chip is bonded to the lead frame from bonding pads by wires. Further, in the SIP, the chip is bonded to the lead frame from bonding pads by wires. By such a constitution, mounting of semiconductor integrated circuit chips with high packaging density can be realized.

Further, as another example of the conventional technique, there has been known a technique in which additional wiring lines are applied to a semiconductor integrated circuit chip such as a CSP (Chip Size Package) or a flip-chip and, thereafter, bumps made of solder, gold or copper are formed and compression-bonded to a substrate thus realizing the mounting of the highly packed semiconductor integrated circuit chip.

Patent document 1: JP-A-2004-134715

Patent document 2: JP-A-2003-007960

Disclosure Of The Invention

Problems to be solved by the Invention

However, in the conventional technique, when only wire bonding is used, wires are used in forming an internal bus which is not connected with an external portion. As a result, a large parasitic inductance and capacitance are added to the internal bus and hence, the use of the semiconductor device in high-speed applications is extremely difficult. Further, when the bumps are formed on the semiconductor integrated circuit chip after applying additional wiring lines to the semiconductor integrated circuit chip as in the case of the CSP or the flip-chip, additional step becomes necessary for respective chips and hence, a manufacturing cost is pushed up.

Accordingly, the present invention has been made to overcome the above-mentioned drawbacks and it is an object of the present invention to provide a semiconductor device which realizes the mounting of a plurality of chips with higher speeds, with higher packaging density and at a low cost than a conventional technique such as a SIP.

Means for solving the Problems

To achieve the above-mentioned object, a semiconductor device of the present invention includes: a wiring chip having a pair of first connection pad groups constituted by a plurality of wiring lines arranged in parallel and a plurality of pads connected to respective one end side and other end side of the wiring lines; a first semiconductor chip, having a group of second connection pads formed of a plurality of pads arranged along one side thereof, and a second semiconductor chip having a group of third connection pad which is formed of a plurality of pads arranged along one side thereof, wherein the first semiconductor chip and the second semiconductor chip are mounted on the wiring chip such that the one side along which the group of second connection pads of the first semiconductor chip are formed and the one side along which the group of third connection pads of the second semiconductor chip are formed to face each other, the group of first connection pads on one side and the group of second connection pads are connected with each other, and the group of first connection pads on another side and the group of third connection pads are connected with each other.

In the semiconductor device of the present invention, when the first semiconductor chip and the second semiconductor chip are mounted on the wiring chip, the arrangement positions of the respective groups of connection pads assume a shortest distance. Corresponding to such arrangement positions, wiring lines which are formed on the wiring chip become short. Accordingly, the first and second semiconductor chips can be mounted on the wiring chip with high packaging density and, at the same time, the wiring distance can be shortened to realize the high-speed operation.

Further, the wiring chip can use an extremely stable manufacturing process compared to the semiconductor chips which are mounted on the wiring chip. Further, the wiring chip can be constituted by merely providing the connection pads and the wiring layer for mounting the semiconductor chip and hence, a high yield can be realized. As a result, it is possible to suppress the increase of a cost of the wiring chip.

Further, since the cost of the wiring chip is lowered, it is possible to form passive elements such as resistors, capacitors, inductances and the like on the wiring chip.

In the present invention, at least one of the first semiconductor chip and the second semiconductor chip may be mounted on the wiring chip via bumps by flip-chip mounting. By mounting the respective semiconductor chips on the wiring chip by flip-chip mounting such that the respective connection bumps are bonded to (connected to) each other via the bumps, compared to a case in which the respective connection bumps are connected with bonding wires, for example, the inductance is reduced to approximately one tenth and hence, it is possible to realize a high-speed interface between internal signals.

Although the bumps are preliminarily formed on the respective pads of the either one or both groups of connection pads, particularly, the bumps may be preliminarily formed on the pads of the first group of connection pads of the wiring chip. Accordingly, the bumps may be formed collectively for multiple chips and hence, a cost for forming the bumps may be lowered, and it is possible to use the existing semiconductor chips with no modification without forming additional wiring lines or bumps on the semiconductor chip to be mounted.

The bumps may be made of metal which contains Au. With the use of such bumps, it is possible to obtain the favorable connection between the respective connection pads.

In the present invention, the first group of connection pads may be constituted of 2000 to 5000 pieces of connection pads. Further, in the present invention, an arrangement pitch of the first to third groups of connection pads may be 20 μm to 60 μm. These number and arrangement pitch of the connection pads are suitably set corresponding to a kind of the semiconductor chip to be mounted.

In the present invention, a semiconductor substrate which constitutes the wiring chip, a semiconductor substrate which constitutes the first semiconductor chip and a semiconductor substrate which constitutes the second semiconductor chip are made of the same material, in particular, of a silicon. By forming the respective chips using the substrate made of the same material, particularly the silicon, a physical strength with respect to heat, elongation and contraction can be increased thus ensuring the high reliability.

In the present invention, the first semiconductor chip may be formed of a memory device chip having a memory means for inputting and outputting signals in parallel for each predetermined number of bits, and the second semiconductor chip may be formed of a specific-use logic circuit chip for inputting and outputting signals in parallel for each predetermined number of bits with the memory device chip. By such a constitution, it is possible to realize the high-speed inputting and outputting of signals while realizing the high packaging density mounting of the memory device chip and of the specific-use logic circuit chip.

In the present invention, the wiring chip may include a plurality of power source lines which supply a predetermined power source voltage to the first semiconductor chip and the second semiconductor chip. By such a constitution, it is possible to reinforce the power source by preventing the lowering of a potential.

In the present invention, a conductive line which prevents crosstalk may be provided between wiring lines of the wiring chip. By such a constitution, even when the wiring lines are formed densely, it is possible to perform the favorable inputting and outputting of signals between the semiconductor chips while preventing crosstalk.

In the present invention, pads for test may be further provided. By such a constitution, even when the first to third connection pads may be arranged with high packaging density, it is possible to perform the inspection of the respective chips. Further, by providing the pads for tests to the memory device chip, with the use of the pads for tests at the time of performing a wafer test of the memory device, it is possible to measure the memory device chip by inputting or outputting test signals to the pads for tests at the time of performing the wafer test.

In the present invention, a first group of power source pads formed of a plurality of pads is formed in a region where the second group of connection pads of the first semiconductor chip is not formed, and all pads which are positioned closest to an outermost periphery of the first semiconductor chip out of the second group of connection pads and the first group of power source pads are set as dummy pads which are not electrically connected with the first group of connection pads, a second group of power source pads formed of a plurality of pads is formed in a region where the third group of connection pads of the second semiconductor chip is not formed, and all pads which are positioned closest to an outermost periphery of the second semiconductor chip out of the third group of connection pads and the second group of power source pads are set as dummy pads which are not electrically connected with the first group of connection pads. By forming all pads which are positioned closest to the outermost periphery of the semiconductor chip where the neighboring pads (or the bumps) are liable to be easily short-circuited as dummy pads, it is possible to surely prevent a connection defect between the chips.

In the present invention, the respective pads of the second group of connection pads of the first semiconductor chip and the respective pads of the third group of connection pads of the second semiconductor chip are connected with each other via the wiring lines so as to make wiring lengths of all of the plurality of wiring lines which is arranged on the wiring chip equal to each other. By such a constitution, resistances of all wiring lines which connect the connection pads of the first semiconductor chip and the connection pads of the second semiconductor chip become equal.

Effect Of The Invention

According to the semiconductor device of the present invention, it is possible to provide the semiconductor device which realizes the mounting of a plurality of chips at a high speed, with high packaging density and at a low cost.

BRIEF EXPLANATION OF DRAWINGS

FIG. 2 is a plan view showing the wiring structure in the semiconductor device of the first embodiment according to the present invention.

FIG. 3 is a plan view showing the constitution of a memory device chip in the semiconductor device of the first embodiment according to the present invention.

BEST MODE FOR IMPLEMENTING THE INVENTION

Next, embodiments to which the present invention is applicable are explained. Following explanation is provided for explaining the embodiments of the present invention and the present invention is not limited by the following embodiments. For the sake of clarity of the explanation, in the description and drawings, the explanation is omitted or simplified when the omission or the simplification is considered appropriate. Further, those who are skilled in the art may easily change, add or convert respective elements of the embodiments described hereinafter within the scope of the present invention. Here, in the respective drawings, parts given the same symbols indicate identical constitutional elements and their explanation is omitted when the omission is considered appropriate.

First Embodiment

Figure 1A:
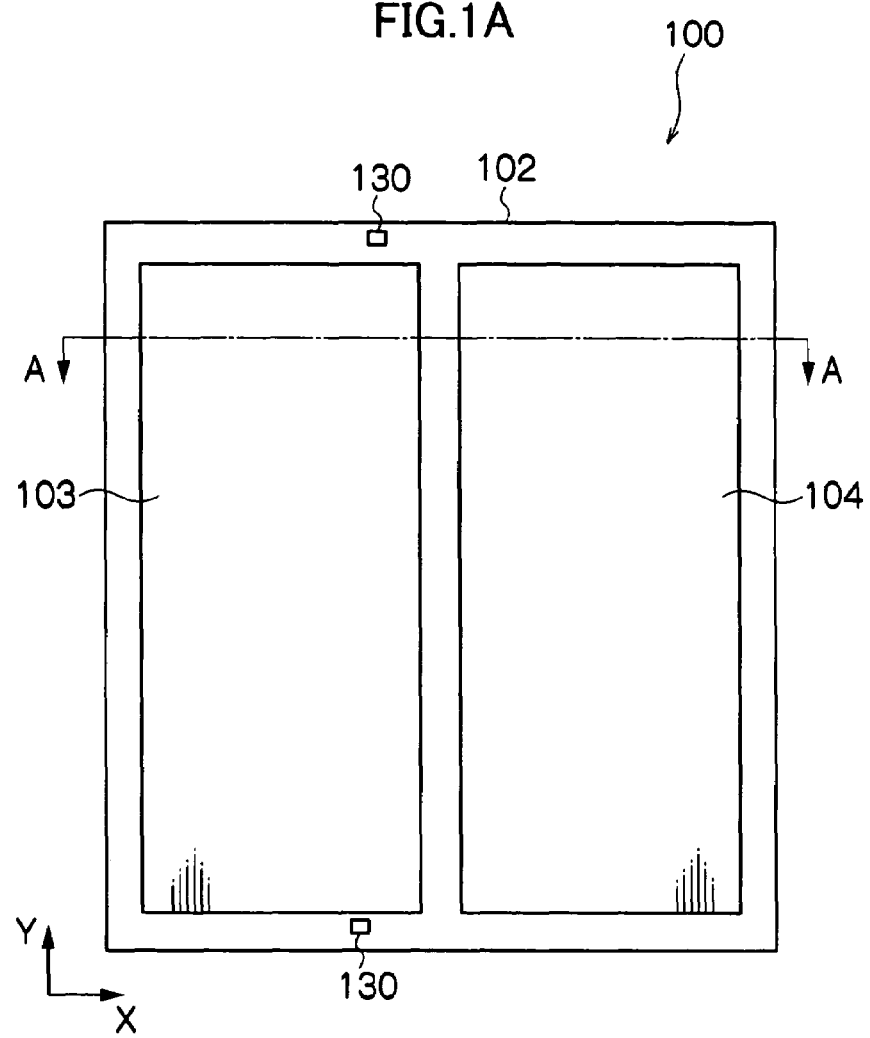
FIG. 1A is a plan view showing an example of the constitution of a semiconductor device according to a first embodiment of the present invention.
Figure 1B:
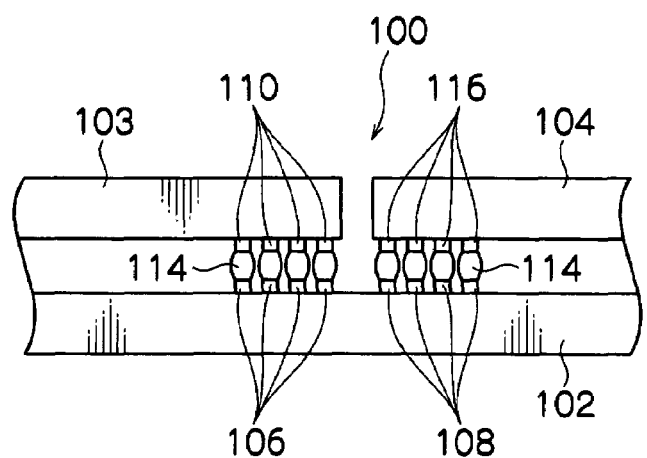
FIG. 1B is a portion of a cross-sectional view taken along a line A-A in FIG. 1A.

In a semiconductor device 100 according to this embodiment, as shown in FIG. 1A and FIG. 1B, a memory device chip 103, an application specific chip (specific-use logic circuit chip, hereinafter abbreviated as ASIC) 104 are mounted on the same main surface of a wiring chip 102. Here, the explanation is made hereinafter on a premise that the direction along one opposing sides of the memory device chip 103 and the ASIC 104 is set as the Y direction, and the direction perpendicular to the Y direction is set as the X direction.

With respect to the wiring chip 102, a plurality of metal wiring lines (for example, aluminum wiring lines, copper wiring lines or the like) is formed in parallel on one main surface of a silicon substrate (see FIG. 2). On one end side and another end side of the respective metal wiring lines, connection pads 106 for mounting the memory device chip 103 and connection pads 108 for mounting the ASIC 104 are respectively connected thus forming groups. These connection pads 106, 108 are arranged along one opposing sides of a mounting region of the memory device chip 103 and a mounting region of the ASIC 104.

The connection pads 106, 108 of the wiring chip 102 are, as shown in FIG. 2, arranged at an equal interval in the Y direction respectively and form groups having a plurality of rows (for 4 rows) in the X direction, wherein the neighboring rows of pads are arranged in a staggered pattern with the displacement of ½ pitch. Here, to focus an attention on one row of the pads in the Y direction, one of the connection pads 106, 108 is arranged on an apex of an equilateral triangle. Then, remaining two apexes of the equilateral triangle are constituted of the neighboring pads which are arranged in the focused one row in the Y direction. Accordingly, the arrangement pitch of the wiring chip 102 in the Y direction corresponds to a perpendicular of the equilateral triangle.

To be more specific, for example, the connection pads 106, 108 of the wiring chip 102 are, as shown in FIG. 2, arranged in plural rows (for example, 4 rows in this embodiment) in the direction of the wiring chip 102 in the X direction at an arrangement pitch of approximately a μm. In this embodiment, the arrangement pitch is set, for example, to 20 μm.

On the other hand, assuming the arrangement pitch of the wiring chip 102 in the X direction as "a" μm, the arrangement pitch b1 of the wiring chip 102 in the Y direction becomes b1=((a*√3)/2) μm. Accordingly, for example, when the arrangement pitch "a" is 20 μm, the arrangement pitch b1 of the wiring chip 102 in the Y direction becomes b1=((20*√3)/2)=17.3 μm.

These arrangement pitches of the connection pads 106, 108 of the wiring chip 102 may be suitably set corresponding to the chip to be mounted. For example, in this embodiment, as the memory device chip 103, multi-media memories (two memories) of 256 Mbits and a band width of the ASIC 104 having at least 256 bits×2=512 bits become necessary. To mount these parts, 20 μm is necessary as the arrangement pitch of the connection pads 106, 108 in the X direction. The arrangement pitch of the connection pads 106, 108 in the X direction is not limited to such a value and may be suitably set to a value within a range from 20 μm to 60 μm, for example.

Further, the numbers of the connection pads 106, 108 of the wiring chip 102 are suitably set corresponding to the chips to be mounted. For example, in this embodiment, since two multi-media memories of 256 Mbits as the memory device chip 103 and the ASIC 104 are mounted, 2000 pieces of the connection pads 106, 108 are provided. The present invention is not limited to such a value and the number of the connection pads may be set to a value which falls within a range from 2000 to 5000 corresponding to the semiconductor chip to be mounted.

The memory device chip 103 is formed on the silicon substrate by a semiconductor process. In this embodiment, as shown in FIG. 3, for example, two multi-media memories 103-1, 103-2 having the memory capacity of 256 Mbits are mounted on the silicon substrate. Here, the memory capacity of the memory device chip 103 is not limited to the above and may be 256 Mbits (512 Mbits in two memories) or more.

Further, the memory device chip 103 is not limited to the above-mentioned memory device chip and a dynamic random access memory (DRAM) for general-purpose may be also used. In the same manner, a static random access memory (SRAM) for general-purpose, a non-volatile memory device or the like may be also used as the memory device chip 103.

In the memory device chip 103, as shown in FIG. 2, connection pads 110 are arranged to face pad opening portions (connection pads 106) of the wiring chip 102. That is, the connection pads 110 are arranged along one side of the chip which faces the ASIC 104 when the memory device chip 103 is mounted on the wiring chip 102 (see FIG. 3).

The connection pads 110 of the memory device chip 103 may be arranged in a staggered pattern in the same manner as the connection pads 106, 108 of the wiring chip 102 thus forming a group.

In the memory device chip 103, testing pads 112 are provided in addition to the connection pads 110 (see FIG. 3) and hence, even when the connection pads 110 are densely arranged, it is possible to perform the inspection of the memory device chip 103. Particularly, in manufacturing the memory device chip 103, test signals are inputted into or outputted from the testing pads 112 so as to measure the memory device chip 103. However, in performing the wafer inspection of the memory device chip 103, when a size (an arrangement pitch) of the connection pads 110 is small, for example, 20 μm, it is difficult to bring a checking probe into contact with the connection pads 110. Accordingly, to facilitate the contact of the checking probe with the connection pads 110 in performing the wafer inspection of the memory device chip 103, testing pads 112 are provided to the memory device chip 103. Here, the testing pads 112 may be provided to the wiring chip 102 or the ASIC 104 besides the memory device chip 103.

In the memory device chip 103, the wiring chip 102 and the pad opening portions are arranged to face each other, the connection pads are physically as well as electrically connected with each other by way of bumps 114 thus establishing flip-chip mounting on the wiring chip 102.

The ASIC 104 is formed on the silicon substrate by a semiconductor process and, for example, a logic circuit including a CPU for general purpose is adopted as such an ASIC 104. In this embodiment, two multi-media memories 103-1, 103-2 having memory capacity of 256 Mbits are mounted as a memory device chip 103 on the silicon substrate and hence, a band width of the ASIC 104 becomes 512 bits. It is needless to say that the memory capacity of the memory device chip 103 may be more than 512 bits.

Further, the ASIC 104 is not limited to such a constitution and, for example, an analog circuit for general purpose including an A/D converter which converts analog signals to digital signals may be used as the ASIC 104. In the same manner, as the ASIC 104, for example, an input/output circuit which drives input/output signals of the ASIC 104 or an input/output circuit which includes an input/output circuit for driving input/output signals of the semiconductor device 100 may be used.

In the ASIC 104, connection pads 116 are arranged to face pad opening portions (connection pads 108) of the wiring chip 102. That is, as shown in FIG. 2, the connection pads 116 are arranged along one side of the chip which faces the memory device chip 103 in an opposed manner when the ASIC 104 is mounted on the wiring chip 102.

The connection pads 116 of the ASIC 104 are arranged in rows in a staggered pattern in the same manner as the connection pads 108 of the wiring chip 102 thus forming a group.

In the ASIC 104, the wiring chip 102 and the pad opening portions are arranged to face each other, the connection pads are physically as well as electrically connected with each other by way of bumps 114 thus establishing flip-chip mounting on the wiring chip 102.

That is, in the semiconductor device 100 according to the present invention, the memory device chip 103 and the ASIC 104 are mounted on the wiring chip 102 in a state that one side along which the connection pads 110 of the memory device chip 103 are formed and one side along which the connection pads 116 of the ASIC 104 are formed to face each other in an opposed manner. Further, the memory device chip 103 and the ASIC 104 are electrically and physically connected with each other via the respective connection pads and metal wiring lines of the wiring chip 102. Here, the ASIC 104 is electrically connected with two multi-media memories 103-1, 103-2 of 256 Mbits which constitutes the memory device chip 103 and hence, inputting/outputting of the signals is performed in parallel for each 512 bits.

Figure 4:
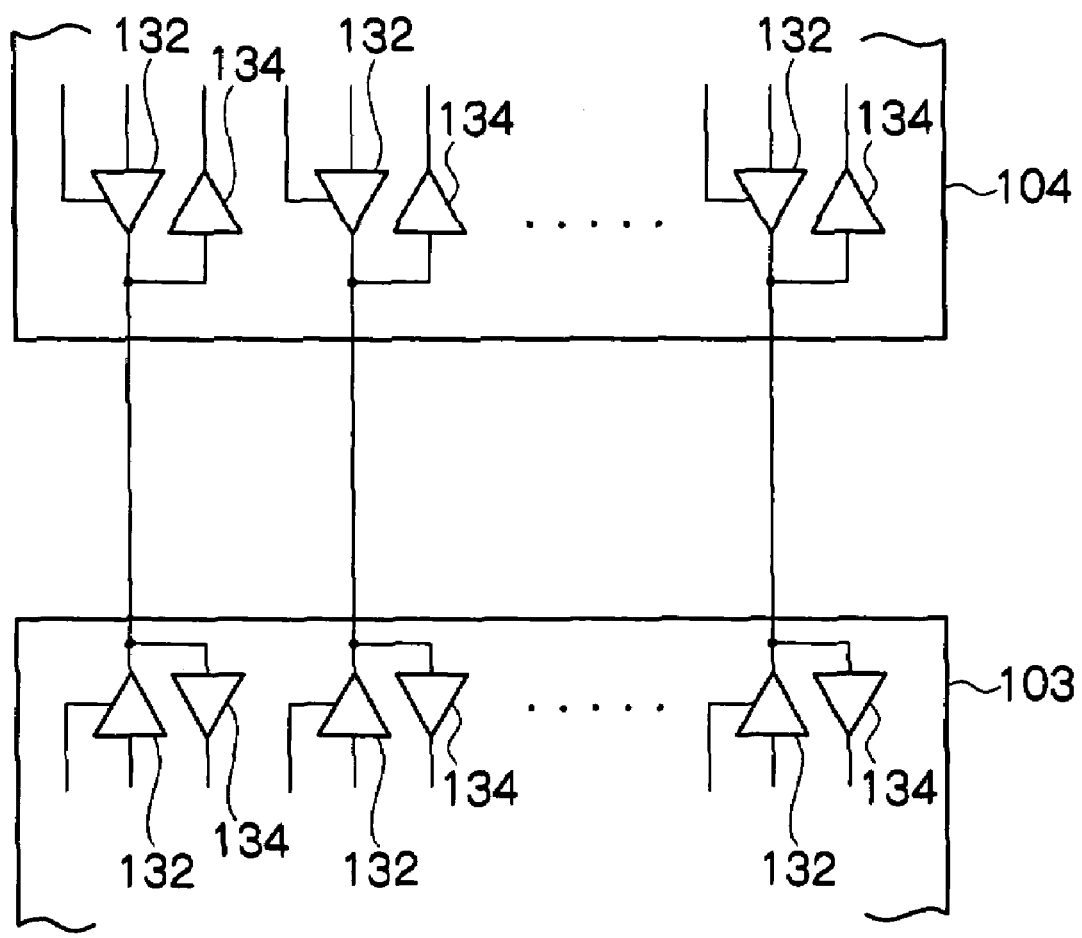
FIG. 4 is a view showing an example of bus line connection of a memory device chip and an ASIC in the semiconductor device of the first embodiment according to the present invention.

Here, the memory device chip 103 and the ASIC 104 are, for example, as shown in FIG. 4, connected with each other by a bus line connection via bus drivers 132 and bus detectors 134, wherein the transaction of signals is performed in parallel. The memory device chip 103 and the ASIC 104 are respectively provided with the bus drivers 132 and the bus detectors 134 which correspond to the respective connection pads 110 and the connection pads 116, wherein the above-mentioned bus line connection is established by connecting the connection pads 110 of the memory device chip 103 and the connection pads 116 of the ASIC 104.

Further, as the bumps 114 which physically and electrically connect the respective connection pads, a micro bump is adopted, and the micro bump may be formed of a gold bump, a solder bump or the like, for example. By adopting the gold bump which contains Au, it is possible to obtain favorable bonding.

The bumps 114 may be preliminarily formed on either one or both of the connection pads of the semiconductor chip and the connection pads of the wiring chip. Here, by preliminarily forming the bumps 114 on the connection pads of the wiring chip, the bumps corresponding to the mounted semiconductor chip can be formed as one and hence, a reduction of cost can be achieved and, also, an existing semiconductor chip can be used as the semiconductor chip without forming additional wiring and bumps. Since the respective chips are connected with each other via the bumps 114, compared to the connection by bonding wires, for example, the inductance is reduced to approximately one tenth thus realizing the high-speed interface between internal signals.

In the semiconductor device 100 according to this embodiment, the respective semiconductor chips are mounted on the wiring chip 102 in a state that the respective semiconductor chips are electrically connected with each other. To be more specific, as shown in FIG. 2, the metal wiring lines 118 which are arranged in the ASIC 104 are connected with the connection pads 116. The connection pads 116 are electrically and physically bonded to the connection pads 108 formed on the wiring chip 102 via the bumps 114.

Further, metal wiring lines 120 formed on the wiring chip 102 are connected with the connection pads 108. The metal wiring lines 120 extend over the wiring chip 102 and are connected with the connection pads 106. The connection pads 106 are electrically and physically bonded to the connection pads 110 of the memory device chip 103 via the bumps 114. The connection pads 110 are connected to metal wiring lines 122 formed on the memory device chip 103. The metal wiring lines 122 are used for propagating signals which are transacted with a width of 512 bits of the memory device chip 103.

Here, in this embodiment, the connection pads 110 of the memory device chip 103 and the connection pads 116 of the ASIC 104 are connected with each other via the metal wiring lines 120 (the connection pads 106 and the connection pads 108 of the wiring chip 102) such that all of the plurality of metal wiring lines 120 which extend over the wiring chip 102 have the same wiring length. To be more specific, for example, the connection pad 110 of the memory device chip 103 which is positioned closest to opposing sides of the memory device chip 103 and the ASIC 104 and the connection pads 116 of the ASIC 104 which is positioned remotest from the opposing sides are connected with each other. Sequentially, the connection pads 110 of the memory device chip 103 which is positioned next closest to the opposing sides of the memory device chip 103 and the ASIC 104 and the connection pads 116 of the ASIC 104 which is positioned next remotest from the opposing sides are connected with each other. As a matter of course, the connection pad 110 of the memory device chip 103 which is positioned remotest from the opposing sides of the memory device chip 103 and the ASIC 104 and the connection pads 116 of the ASIC 104 which is positioned closest to the opposing sides are connected with each other. Here, the connection pads which are connected with each other are the connection pads which are overlapped on the same X axis (the direction perpendicular to the opposing sides of the memory device chip 103 and the ASIC 104). By such a constitution, the wiring lengths of all metal wiring lines 120 become equal and hence, the line resistances of the wiring lines which connect all connection pads 110 of the memory device chip 103 and all connection pads 116 of the ASIC 104 become equal.

Further, the wiring chip 102 includes a power source supply line 124 for supplying power source to the memory device chip 103 and the ASIC 104. The power source supply from the outside is performed via an external terminal 130 (see FIG. 3) which is formed on the wiring chip 102. Further, from a VDD power source line 126 and a GND power source line 128 out of the power source supply line 124, the power source is supplied to the memory device chip 103 and the ASIC 104 via respective power source pads 126-1, 128-1.

Here, although not shown in the drawing, each chip includes a passivation film which protects parts except for the connection pads, an insulation film which is formed on the chip and the like.

In the above-mentioned embodiment, when the memory device chip 103 and the ASIC 104 are mounted on the wiring chip 102 by flip-chip mounting, the memory device chip 103 and the ASIC 104 are respectively provided with the connection pads 110, 116 along respective one sides thereof opposing the wiring chip 102. Accordingly, the relative arrangement positions of the connection pads 110, 116 are the shortest distance apart and, also the metal wiring lines provided on the wiring chip 102 can be shortened. Accordingly, it is possible to mount the memory device chip 103 and the ASIC 104 on the wiring chip 102 with high packaging density and, at the same time, since the wiring distance can be shortened, high speed operation can be realized.

Further, the wiring chip 102 can use an extremely stable manufacturing process compared to the memory device chip 103 and the ASIC 104 which are mounted on the wiring chip 102. Further, the wiring chip 102 can be constituted by merely providing the connection pads 106, 108 and the metal wiring lines for mounting the memory device chip 103 and the ASIC 104 and hence, a high yield ratio can be realized. As a result, it is possible to suppress the increase of cost of the wiring chips.

Further, the wiring chip 102 uses the same silicon substrate as that of the memory device chip 103 and the ASIC 104 mounted on the wiring chip 102 and hence, the wiring chip 102 exhibits high physical strength with respect to heat, the elongation and contraction thus ensuring high reliability.

Second Embodiment

Figure 5:
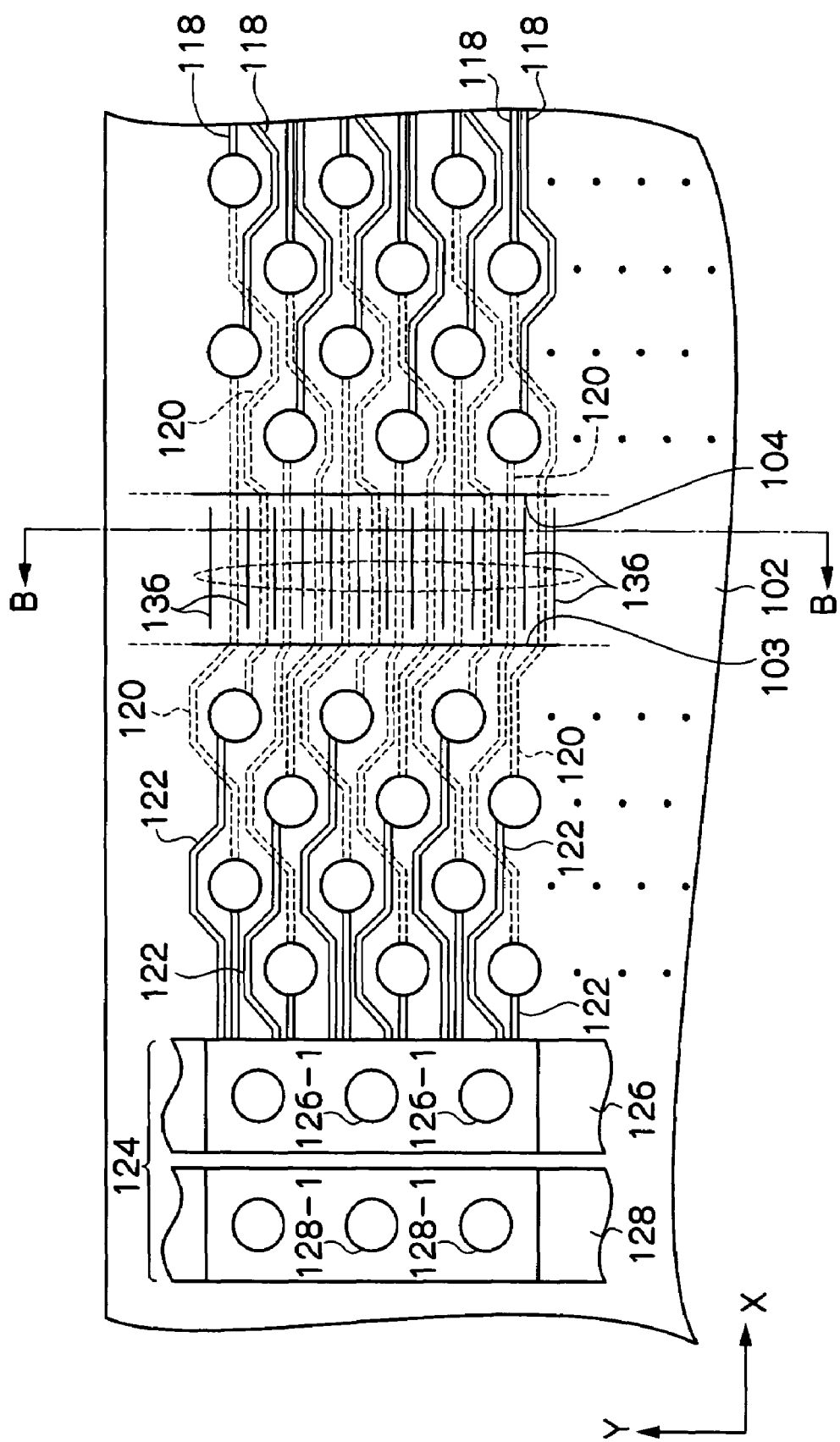
FIG. 5 is a plan view showing the wiring structure in the semiconductor device of the second embodiment according to the present invention.
Figure 6:
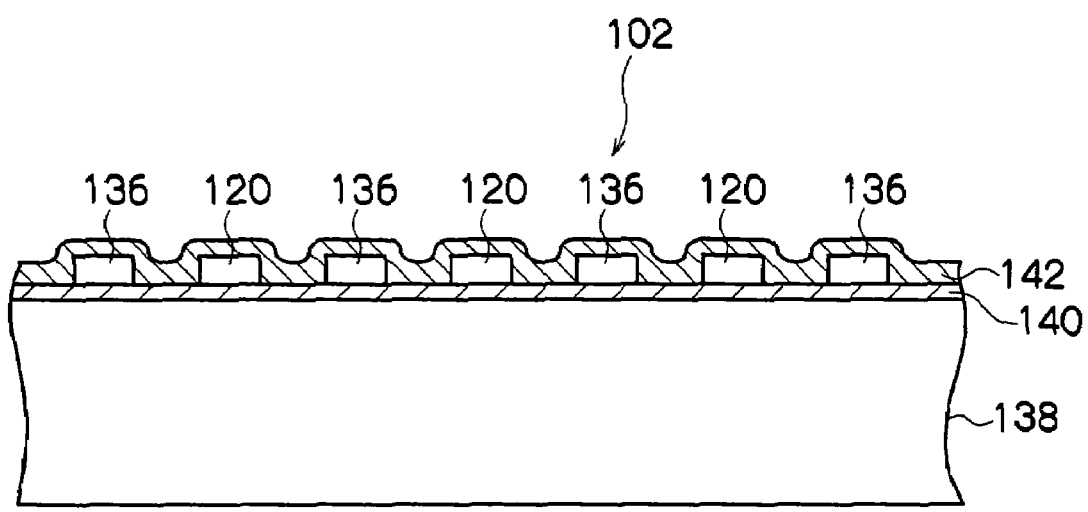
FIG. 6 is a cross-sectional view taken along a line B-B in FIG. 5.

In this embodiment, as shown in FIG. 5, GND lines 136 are provided between metal wiring lines 120 which connect between connection pads 106 and connection pads 108 on a wiring chip 102. The metal wiring lines 120 and the GND lines 136 are, as shown in FIG. 6, alternately formed on an insulation film 140 which is formed on a silicon substrate 138 and, further, are covered with a protective film 142. The constitution of this embodiment except for the above-mentioned constitution is substantially equal to the constitution of the first embodiment and hence, the explanation is omitted.

Usually, when the wiring interval becomes fine, there exists a possibility that crosstalk is generated By the influence of an electric field generated by wiring lines.

Accordingly, in this embodiment, by providing the GND lines 136 between the metal wiring lines 120, it is possible to prevent the crosstalk which may be generated between the metal wiring lines 120.

Figure 7A:
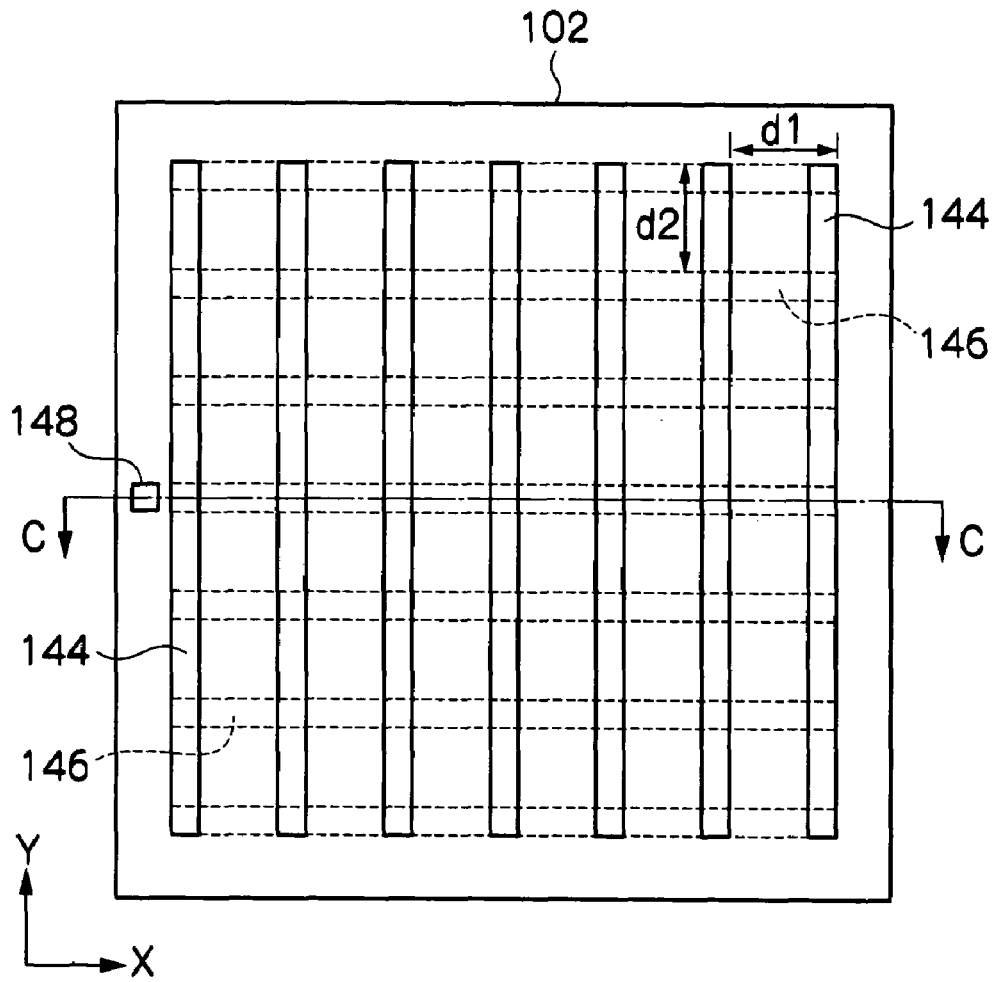
FIG. 7A is a plan view showing the constitution of a wiring chip in the semiconductor device of the second embodiment according to the present invention.
Figure 7B:
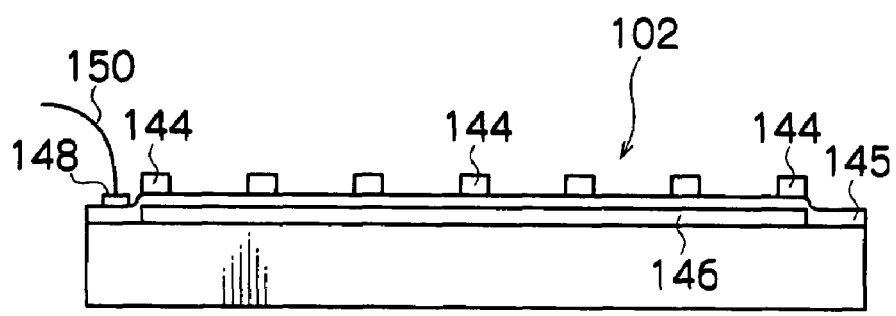
FIG. 7B is a cross-sectional view taken along a line C-C in FIG. 7A.

Further, in this embodiment, as shown in FIG. 7A and FIG. 7B, to allow the wiring chip 102 to supply the power source to the memory device chip 103 in a stable manner, the wiring chip 102 includes reinforced power source lines 144 and reinforced GND lines 146. Here, in these drawings, only the reinforced power source lines 144 and the reinforced GND lines 146 are indicated and other parts are omitted.

These reinforced power source lines 144 and the reinforced GND lines 146 are stacked by way of an insulation film 145. Further, the reinforced power source lines 144 and the reinforced GND lines 146 are arranged in a matrix array such that these power source lines are arranged orthogonal to each other in the X direction and in the Y direction of the wiring chip 102. To be more specific, for example, the same number (for example, 7 pieces) of the reinforced power source lines 144 and the reinforced GND lines 146 are arranged in a matrix array such that these power source lines are arranged orthogonal to each other in the X direction and in the Y direction of the wiring chip 102 at an equal interval. Further, a wiring pitch (d1) of the reinforced power source lines 144 and a wiring pitch (d2) of the reinforced GND lines 146 are suitably set. For example, the wiring pitches (d1), (d2) may be set such that d1=d2=50 µm.

Further, a pad 148 for external connection of the wiring chip 102 is connected with an external lead (not shown in the drawing) via a bonding wire 150.

Further, the wiring chip 102 is, although not shown in the drawing, fixed to a lead made of the same material as the external lead, wherein an external signal which is supplied from the bump via the pad is propagated to the inside of the wiring chip 102 as an internal signal of the wiring chip 102 via an electrostatic protective circuit which is present on a semiconductor integrated circuit chip.

Figure 8A:
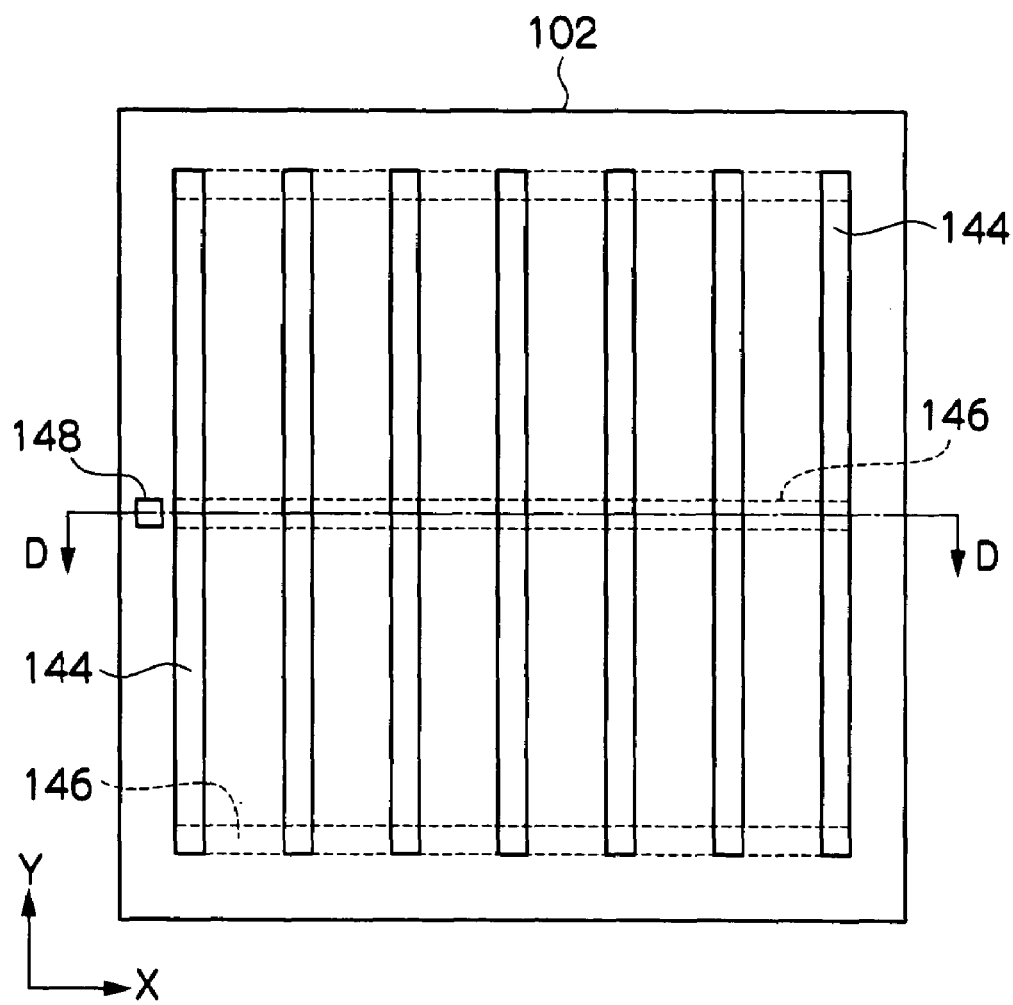
FIG. 8A is a plan view showing another constitution of a wiring chip in the semiconductor device of the second embodiment according to the present invention.
Figure 8B:
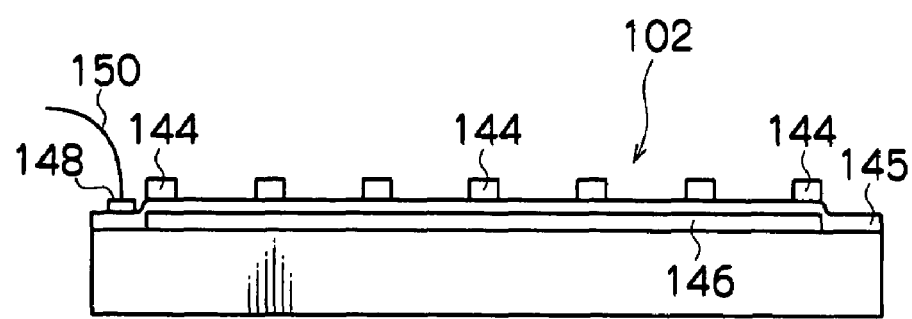
FIG. 8B is a cross-sectional view taken along a line D-D in FIG. 8A.

Here, the reinforced power source lines 144 and the reinforced GND lines 146 are not limited to the above-mentioned constitution and, for example, as shown in FIG. 8A and FIG. 8B, 7 pieces of reinforced power source lines 144 and 2 pieces of reinforced GND lines 146 may be arranged such that these power source lines are arranged orthogonal to each other in the X direction and in the Y direction of the wiring chip 102 at equal intervals.

By providing the plurality of reinforced power source lines 144 on the wiring chip 102, a potential drop is hardly generated thus reinforcing the power source.

Figure 9A:
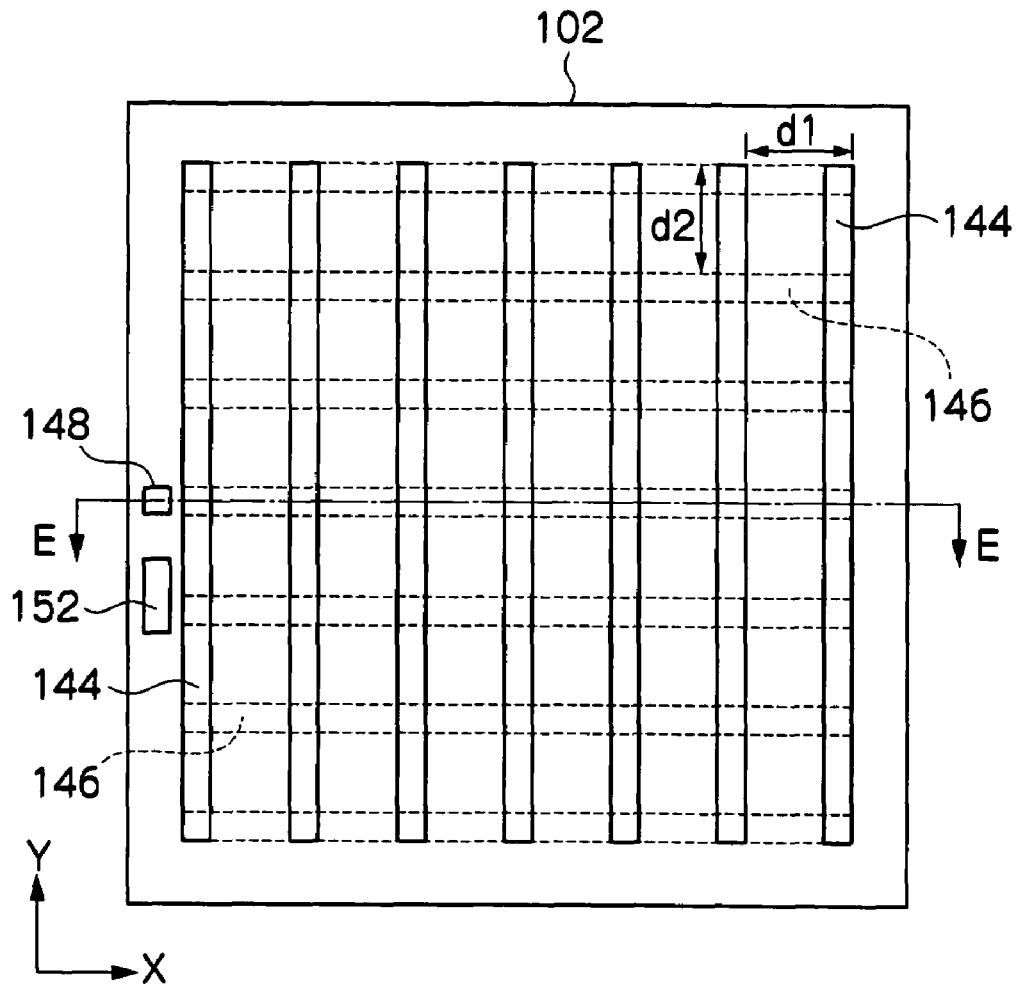
FIG. 9A is a plan view showing still another constitution of a wiring chip in the semiconductor device of the second embodiment according to the present invention.
Figure 9B:
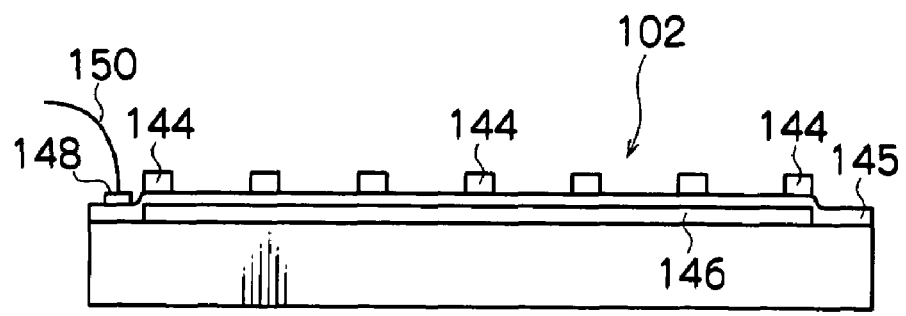
FIG. 9B is a cross-sectional view taken along a line E-E in FIG. 9A.

Further, as shown in FIG. 9A and FIG. 9B, an on-chip capacitance 152 may be formed on the wiring chip 102. This on-chip capacitance 152 may be electrically and physically bonded via a bump (not shown in the drawing) in a face-down structure in which a surface of the wiring chip 102 on which the pads are present is directed downwardly. Passive elements which are provided to the wiring chip 102 are not limited to the above-mentioned elements and a passive element may be formed of resistance or inductor or the like.

Third Embodiment

Figure 10:
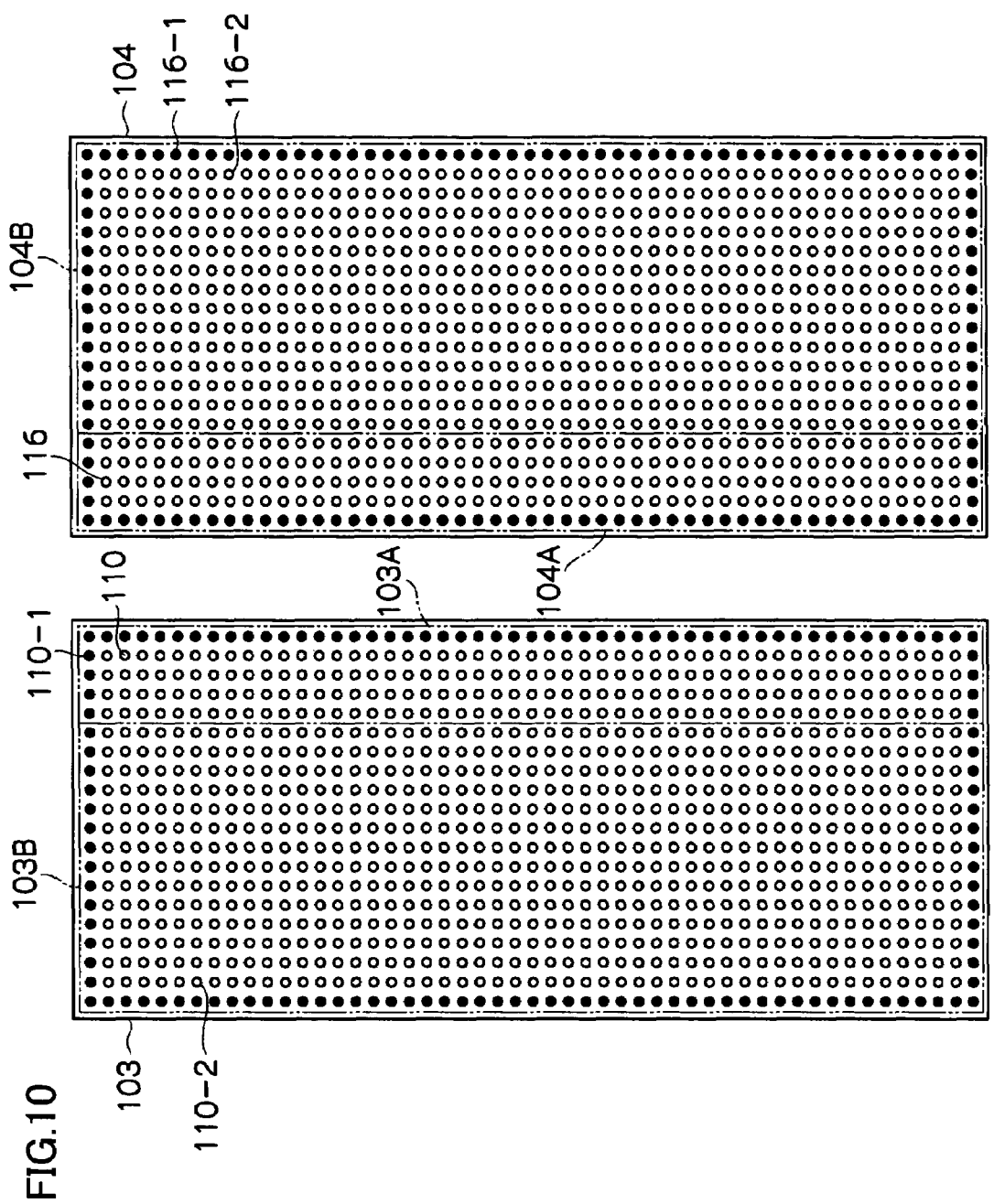
FIG. 10 is a plan view showing the constitution of a memory device chip and an ASIC in a semiconductor device of the third embodiment according to the present invention.

In this embodiment, as shown in FIG. 10, in a memory device chip 103, the connection pad 110 is arranged to a region 103A along one side of the memory device chip 103 which faces the ASIC 104 and, at the same time, power source pads 110-2 (pads of a first group of power source pads) on other regions 103B of the whole surface of the memory device chip 103. These connection pads 110 and the power source pads 110-2 are arranged in a matrix array at a predetermined pitch and with a predetermined size. Then, out of the connection pads 110 and the power source pads 110-2, all of pads which are positioned closest to an outermost periphery (a peripheral portion) of the memory device chip 103 are formed into dummy pads 110-1 which are not electrically connected with pads of a wiring chip 102. Here, although not shown in the drawing, out of bumps which are connected with the respective pads of the memory device chip 103, bumps which are connected with the dummy pads constitute dummy bumps.

Further, in the same manner, in the ASIC 104, connection pads 116 are arranged in a region 104A along one side of the ASIC 104 which faces the memory device chip 103 in an opposed manner and, at the same time, power source pads 116-2 (pads of a second group of power source pads) are arranged on other regions 104B of the whole surface of the ASIC 104. These connection pads 116 and the power source pads 116-2 are arranged in a matrix array at a predetermined pitch and with a predetermined size. Then, out of the connection pads 116 and the power source pads 116-2, all of pads which are positioned closest to an outermost periphery (a peripheral portion) of the ASIC 104 are formed into dummy pads 110-1 which are not electrically connected with pads of a wiring chip 102. Here, although not shown in the drawing, out of bumps which are connected with the respective pads of the ASIC 104, bumps which are connected with the dummy pads constitute dummy bumps.

In this manner, according to this embodiment, the pads (the connection pads and the power source pads) are formed in a region surrounded by the dummy bumps, further, although not shown in the drawing, in the wiring chip 102, pads corresponding to the connection pads, the power source pads and the dummy pads of the memory device chip 103 and of the ASIC 104 are arranged and connected with these pads via the bumps. Further, by preparing the dummy pads in advance in a state that electrical connection is not established inside the chip, a non-electrical connection state of the dummy pads with the pads of the wiring chip 102 is ensured.

Further, in the above-mentioned constitution, the dummy pads are formed by preparing the pads in advance without establishing electrical connection inside the chip. However, the pads may be formed into the dummy pads such that the pads are not physically connected with the outside, thus in a state of a non-electrical connection.

Since the constitution of this embodiment is substantially equal to the constitution of the first embodiment except for the above, further explanation is omitted. Further, in FIG. 10, the constitution other than the pads of the memory device chip and the ASIC is omitted.

Here, in the flip-chip mounting in which the semiconductor chip (the semiconductor integrated circuit chip) and the substrate (wiring chip) are connected via the bumps, it has been well known that a stress is applied to the bumps By the thermal deformation or an impact after the connection. Accordingly, to alleviate the stress concentration in the bumps and to enhance the hermetic adhesion of the semiconductor chip and the substrate, there has been generally adopted a method which fills, for example, an epoxy-based underfill resin (not shown in the drawing) between the semiconductor chip and the substrate.

Accordingly, usually, on pad-forming surfaces of the semiconductor chips such as the memory device chip 103 and the ASIC 104, although not shown in the drawing, there is an underfill resin is filler. In the underfill resin filler, the underfill resin hardly flows between pads (between bumps when the bumps are formed) which are positioned closest to the outermost periphery of the semiconductor chip depending on a shape and an arrangement position relationship of the semiconductor chip, thus giving rise to a possibility that cavities (voids) where the underfill resin is not filled are formed. When such voids of the underfill resin are present, in the heat treatment such as reflow at the time of mounting the chips, there exists a possibility that a short circuit occur in the neighboring pads (or neighboring dumps).

Further, bumps on the outermost periphery of the semiconductor chip are liable to be easily influenced by a mechanical impact in a dicing step to form individual pieces from a wafer and a mounting step, wherein when the bump is partially cracked, a yield of the formation of the bumps is lowered thus giving rise to a drawback that a yield of an SIP chip as a whole is largely influenced.

Accordingly, in this embodiment, by forming all pads which are positioned closest to the outermost peripheries (peripheral portions) of the memory device chip 103 and the ASIC 104 into the dummy pads 110-1, 116-1 (or the dummy bumps) which are not electrically connected with the pads of the wiring chip 102, it is possible to surely prevent the connection failure between the chips even when the underfill resin is not filled between the pads. Further, the yield of the bump formation is not lowered and hence, the high yield can be realized with respect to the SIP chip as a whole.

Here, two applications are considered with respect to the semiconductor device of the present invention which has been explained in conjunction with the above-mentioned respective embodiments. The first application is a case in which as in a case of a portable equipment, it is necessary to miniaturize a volume of the semiconductor device, the development must be completed at a low cost and within a short period, and the semiconductor device is integrated into one package together with a currently existing chip. In this case, the priority should be assigned to a cost as much as possible by forming a wiring layer of the wiring chip into one layer. The second application is a case in which a chip, which enables the high-speed transfer of signals along an internal bus, is combined as in the case of the combination of a memory chip and a logic chip. In this case, a width of the bus is increased and also the wiring of only one layer is difficult to achieve the high-speed transfer of signals. However, by adopting bump bonding, the performance equivalent to the performance of one chip can be expected and, at the same time, the respective chips can be manufactured by an optimum process whereby the high speed operation and the reduction of leaking can be realized.

Further, the semiconductor device of the present invention can achieve not only the improvement of the SPI which aims at the simple reduction of the mounting surface but also, as in the case of the semiconductor chip according to this embodiment, the remarkable improvement of a transfer RATE between busses of the semiconductor device having a multiple-bit I/O array (for example, a group of bumps having a bit width of 256 to 4096 bits) on which micro bumps are mounted.

Further, by additionally providing the above-mentioned multiple-bit I/O array to a dynamic random access memory (DRAM) side and a specific-use integrated circuit chip (ASIC) side, and by allowing the respective multiple-bit I/O arrays to face each other, wiring lines on a silicon interposer (the wiring chip) can be made shortest thus remarkably improving the transfer RATE between the busses. Further, by reducing the frequency of the semiconductor device to approximately one tenth of the frequency of a DDR (Double Data Rate) synchronous dynamic random memory (DDR-SDRRAM) having the same performance, for example, and by using micro bumps and a silicon interposer, it is possible to reduce the addition of parts attributed to the addition of the I/O array terminals thus largely reducing the power consumption.

INDUSTRIAL APPLICABILITY

In this manner, according to the present invention, it is possible to efficiently integrate the plurality of semiconductor integrated circuit chips and hence, the present invention is effective in mounting of the system such as a mobile phone, a PDA, a steel camera, a digital video camera, a wrist watch-type portable equipment which aims at the miniaturization of volume and the reduction of the power consumption. Further, by constituting the high-speed internal busses, the present invention is effective in the miniaturization and the achievement of the high performance of the system relevant to the graphic chips and personal computer.

EXPLANATION OF SYMBOLS

100: semiconductor device
102: wiring chip
103: memory device chip
104: ASIC (specific-use logic circuit chip)
106, 108, 110, 116: connection pad
112: testing pad
114: bump
118, 120, 122: metal line
124: power source line
144: reinforced power source line
146: reinforced GND line

The invention claimed is:
1. A semiconductor device comprising:
a wiring chip having a pair of first connection pad groups that comprise a plurality of wiring lines arranged in parallel and a plurality of pads connected to respective one end side and other end side of the wiring lines and are arranged in a staggered pattern;
a first semiconductor chip, having a group of second connection pads that is formed of a plurality of pads arranged along one side thereof in a staggered pattern; and
a second semiconductor chip, having a group of third connection pads that is formed of a plurality of pads arranged along one side thereof in a staggered pattern, wherein
the first semiconductor chip and the second semiconductor chip are mounted on the wiring chip via bumps by flip chip mounting such that
the one side along which the second connection pads of the first semiconductor chip are formed and the one side along which the third connection pads of the second semiconductor chip are formed so as to face each other,
the group of first connection pads on one side and the group of second connection pads are connected with each other,
the group of first connection pads on another side and the group of third connection pads are connected with each other, and the first semiconductor chip and the second conductor chip are connected with each other by a bus line connection via bus drivers and bus detectors that are provided to the respective chips, a semiconductor substrate that constitutes the wiring chip, a semiconductor substrate that constitutes the first semiconductor chips, and a semiconductor substrate that constitutes second semiconductor chip are formed of a silicon substrate,
the first semiconductor chip is a memory device chip having a memory means that inputs and outputs signals in parallel for each predetermined number of bits, and the second semiconductor chip is a logic circuit chip that inputs and outputs signals in parallel for each predetermined number of bits with the memory device chip, and
the respective pads of the second group of connection pads of the first semiconductor chip and the respective pads of the third group of connection pads of the second semiconductor chip are connected with each other via the wiring lines such that all of the plurality of wiring lines arranged on the wiring chip have the same wiring length, wherein the pads of the second group of connection pads of the first semiconductor chip positioned closest to opposing sides of the first semiconductor chip and the second semiconductor chip and the pads of the third group of connection pads of the second semiconductor chip positioned remotest from the opposing sides are connected and, at the same time, the pads of the second group of the connection pads of the first semiconductor chip positioned remotest from the opposing sides and the pads of the third group of the connection pads of the second semiconductor chip positioned closest to the opposing sides are connected.

2. A semiconductor device according to claim 1, wherein the bumps are formed on the respective pads that constitute the first group of connection pads in advance.

3. A semiconductor device according to claim 1, wherein the bumps are made of metal that contains Au.

4. A semiconductor device according to claim 1, wherein the first group of connection pads comprises 2000 to 5000 pieces of connection pads.

5. A semiconductor device according to claim 1, wherein an arrangement pitch of the pads that constitute the first groups of connection pads, the second groups of connection pads, and the third groups of connection pads is set to 20 μm to 60 μm.

6. A semiconductor device according to claim 1, wherein a semiconductor substrate that constitutes the wiring chip, a semiconductor substrate that constitutes the first semiconductor chip, and a semiconductor substrate that constitutes the second semiconductor chip are made of the same material.

7. A semiconductor device according to claim 1, wherein the wiring chip includes a plurality of power source lines that supplies predetermined power source voltages to the first semiconductor chip and the second semiconductor chip.

8. A semiconductor device according to claim 1, wherein a conductive wiring line which that prevents crosstalk is provided between wiring lines of the wiring chip.

9. A semiconductor device according to claim 1, further comprising test pads.

10. A semiconductor device according to claim 9, wherein the test pads are provided on the memory device chip for use when performing a wafer test of the memory device chip, and the memory device chip is measured by inputting and/or outputting test signals to the test pads at the time of performing the wafer test.

11. A semiconductor device according to claim 1, wherein a first group of power source pads formed of a plurality of pads is formed in a region where the second group of connection pads of the first semiconductor chip is not formed, and all pads that are positioned closest to an outermost periphery of the first semiconductor chip out of the second group of connection pads and the first group of power source pads are set as dummy pads that are not electrically connected with the first group of connection pads, a second group of power source pads formed of a plurality of pads is formed in a region where the third group of connection pads of the second semiconductor chip is not formed, and all pads that are positioned closest to an outermost periphery of the second semiconductor chip out of the third group of connection pads and the second group of power source pads are set as dummy pads that are not electrically connected with the first group of connection pads.

* * * * *